United States Patent
Kazama (10) Patent No.: US 7,843,203 B2
(45) Date of Patent: *Nov. 30, 2010

(54) SUPPORT MEMBER ASSEMBLY HAVING REINFORCEMENT MEMBER FOR CONDUCTIVE CONTACT MEMBERS

(75) Inventor: Toshio Kazama, Nagano (JP)

(73) Assignee: NHK Spring Co., Ltd., Yokohama-Shi (JP)

( * ) Notice: Subject to any disclaimer, the term of this patent is extended or adjusted under 35 U.S.C. 154(b) by 211 days.

This patent is subject to a terminal disclaimer.

(21) Appl. No.: 12/128,504

(22) Filed: May 28, 2008

(65) Prior Publication Data

US 2008/0224720 A1  Sep. 18, 2008

Related U.S. Application Data

(60) Division of application No. 11/125,290, filed on May 9, 2005, now Pat. No. 7,714,597, which is a continuation-in-part of application No. 10/481,089, filed as application No. PCT/JP01/05554 on Jun. 28, 2001, now abandoned.

(51) Int. Cl.
*G01R 31/02* (2006.01)

(52) U.S. Cl. ........................... 324/754; 324/761

(58) Field of Classification Search .............. None
See application file for complete search history.

(56) References Cited

U.S. PATENT DOCUMENTS

| 3,992,665 | A | * | 11/1976 | Preikschat | 324/666 |
| 4,161,692 | A | * | 7/1979 | Tarzwell | 324/754 |
| 5,157,325 | A | | 10/1992 | Murphy | |
| 5,461,327 | A | | 10/1995 | Shibata et al. | |
| 5,670,889 | A | | 9/1997 | Okubo et al. | |
| 5,886,535 | A | | 3/1999 | Budnaitis | |
| 5,986,338 | A | * | 11/1999 | Nakajima | 257/700 |
| 5,990,697 | A | | 11/1999 | Kazama | |
| 7,053,635 | B2 | * | 5/2006 | Kazama et al. | 324/754 |

* cited by examiner

*Primary Examiner*—Vinh P Nguyen
(74) *Attorney, Agent, or Firm*—Haynes and Boone, LLP (57) ABSTRACT

Provided is a support member assembly suitable for use in a contact probe head comprising a support member formed with a plurality of holder holes for supporting conductive contact members in a mutually parallel relationship, and a reinforcing member integrally formed with the support member and extending in a part of the support member devoid of any holder holes. The reinforcing member increases the overall mechanical strength of the support member assembly, and prevents the thermal deformation of the support member. Because the holder holes are formed in the support member made of material suitable for forming holes, such as plastic material and ceramic material, the holder holes can be formed at high precision and at low cost.

9 Claims, 8 Drawing Sheets

Fig.14

SUPPORT MEMBER ASSEMBLY HAVING REINFORCEMENT MEMBER FOR CONDUCTIVE CONTACT MEMBERS

CROSS REFERENCE TO RELATED APPLICATIONS

The present application is a divisional of U.S. patent application Ser. No. 11/125,290, filed on May 9, 2005, now U.S Pat. No. 7,714,597 which is a continuation-in-part of now-abandoned U.S. patent application Ser. No. 10/481,089, filed on Jul. 6, 2004 by Toshio Kazama, entitled "Support Member Assembly for Conductive Contact Members," which is in turn the National Stage of International Application No. PCT/JP01/05554, filed Jun. 28, 2001, all of which are incorporated herein by reference in their entireties.

TECHNICAL FIELD

The present invention generally relates to a support arrangement for conductive contact members for contact probe heads, electric sockets and other applications, and in particular relates to a support member assembly for conductive contact members for contact probe heads suitable for burn-in tests of semiconductor related components.

BACKGROUND OF THE INVENTION

In recent years, burn-in tests are routinely conducted as a part of a test process for semiconductor related components, and in such a test a voltage is applied to an object for a prolonged period of time (from few hours to tens of hours) at an elevated temperature (approximately 150° C.). It is more and more preferred to conduct such a test on a wafer level (8 inch or 200 mm wafer) rather than on a package level so that the yield factor may be improved. At any event, when applying a contact probe head for simultaneously accessing a large number of points during a burn-in test, the heat resistance and thermal expansion of the support member for electric contact members are important factors that need to be taken into account.

Figure 14:
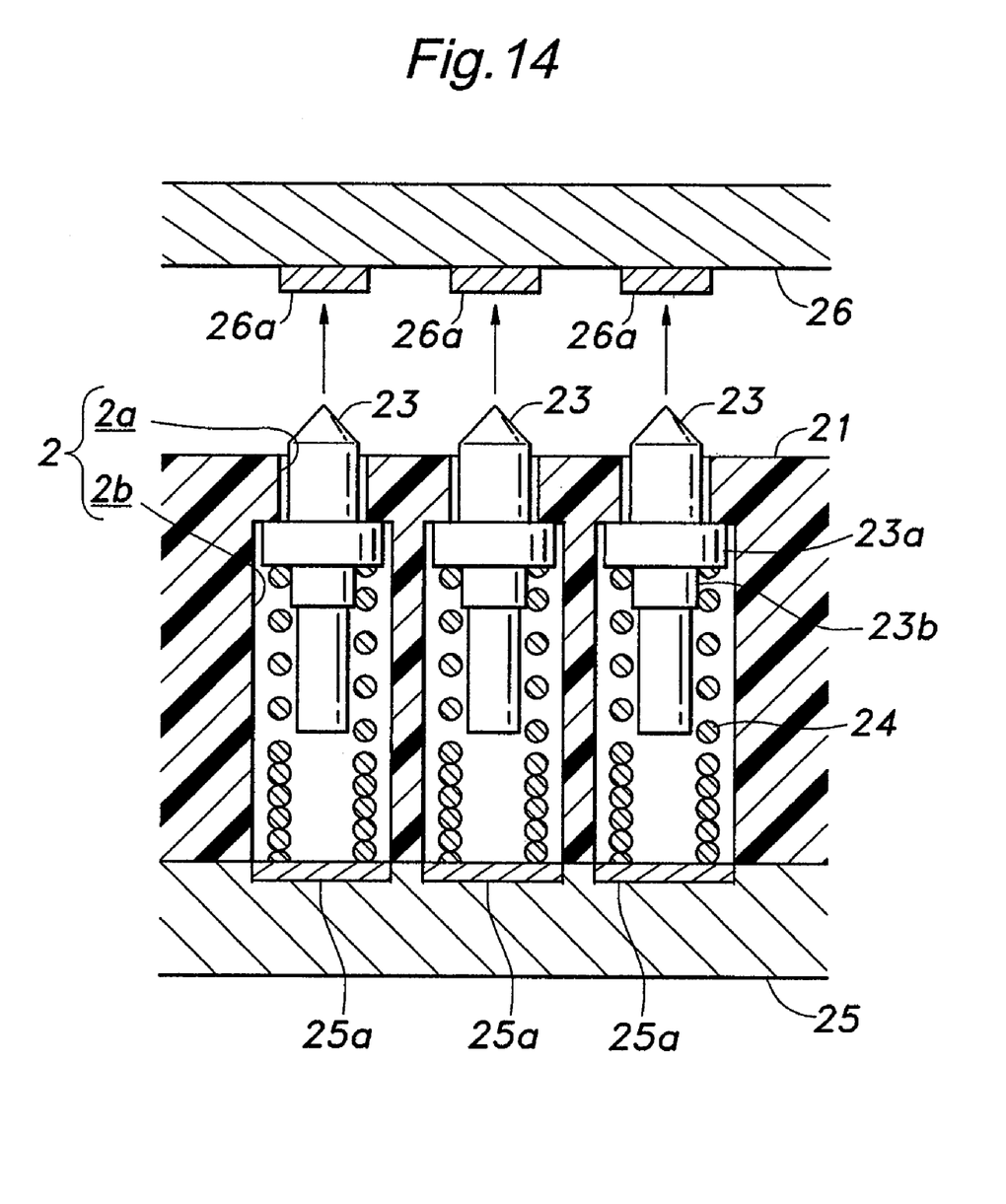
FIG. 14 is a sectional side view, partly in section, showing a conventional support member assembly along with conductive contact members.

The conductive contact member is desired to be able to accommodate variations in the height of the corresponding electrode on the wafer by resiliently engaging such an electrode. Such an example is illustrated in FIG. 14. Referring to FIG. 14, a plurality of stepped holder holes 2 are passed across the thickness of a support member 21 in the form of a plate member. A small diameter section 2a of each holder hole 2 slidably receives a conductive needle member 23, and a large diameter section 2b of the holder hole 2 receives a conductive coil spring 24. The conductive needle member 23 includes a radial flange 23a which is received in the large diameter section 2b, and is resiliently urged by the coil spring 24 having one end wound around a stem portion 23b extending from the flange 23a. The other end of the coil spring 24 resiliently engages a corresponding terminal 25a of a circuit board 25 which is placed over the support member 21. The terminal 25a is connected to an electric circuit of a tester not shown in the drawing.

A number of such conductive needle members 23 are arranged in parallel to each other in the support member 21 as illustrated in FIG. 14 to form a contact probe head capable of accessing a plurality of points at the same time. An electric test is conducted by pushing such conductive needle members 23 onto the electrodes 26a of a wafer 26 (object to be tested) in a resilient manner.

To allow a plurality of electrodes 26a on the wafer 26 to be accessed at the same time as mentioned above, it is necessary to arrange in the support member 21 a same number of conductive contact members 23 as the number of the electrodes 26a on the wafer 26, and the support member 21 is required to be formed with a large number of holder holes 2 in a precise manner. Furthermore, because an elevated temperature in the order of 120 to 150° C. is maintained for tens of hours in a burn-in test, the contact probe head is required to be provided with a corresponding heat resistance and low thermal coefficient.

The materials having a heat resistance and thermal coefficient comparable to that of silicon serving as the material for a wafer include ceramics, glass and low thermal expansion alloys such as invar as well as silicon. However, machining a silicon member is a time-consuming process, and silicon requires electric insulation. Ceramics are known to be difficult to machine. Glass involves significant dimensional errors when machining, and this results in a poor yield factor. A low thermal expansion alloy is difficult to machine, and requires electric insulation. Therefore, when such materials are selected for the support member of a contact probe head, the production efficiency is low, and the production cost is high.

Plastic material suited for precision machining is suitable as the material for the support member. However, in a contact probe head having a large number of conductive contact members arranged in a support member at a high density, the pressure produced from such a large number of conductive contact members may cause a warping of the support member. The thermal expansion may cause positional errors of the conductive contact members (conductive needle members), and the access point of each conductive contact member may unacceptably offset from the desired point.

BRIEF SUMMARY OF THE INVENTION

In view of such problems of the prior art, a primary object of the present invention is to provide a support member assembly for supporting conductive contact members in a contact probe head or the like which allows small holder holes to be formed at high density and at high precision, and demonstrates a high mechanical rigidity.

A second object of the present invention is to provide a support member assembly for supporting conductive contact members in a contact probe head or the like which allows small holder holes to be formed at high density and at high precision, and undergoes a thermal expansion in a controlled manner.

A third object of the present invention is to provide such a support member assembly for supporting conductive contact members in a contact probe head or the like which is both economical and easy to manufacture.

According to the present invention, such objects can be accomplished by providing a support member assembly suitable for use in a contact probe head or the like for contacting an object to be contacted, comprising: a support member formed with a plurality of holder holes for supporting conductive contact members in a mutually parallel relationship, the support member being made of material suitable for forming such holder holes; and a reinforcing member integrally formed with the support member and surrounding at least a part of the support member that defines the holder holes.

Thus, because the holder holes for supporting conductive contact members can be formed at high precision by forming the holder from material suitable for forming such holes such as plastic material and ceramic material, the holder holes may be arranged in fine pitches at high precision to the extent that is required in wafer level tests. Even when plastic material such as PPS, LCP, PES and PEI or ceramic material having a relatively high brittleness which may by itself not be provided with the desired mechanical property for a support member is used, the reinforcing member ensures the overall mechanical strength of the support member assembly. The reinforcing member may consist of any materials having desired mechanical properties such as mechanical strength and rigidity, and such materials include metallic materials, glass, ceramics and silicon. When a low thermal expansion coefficient material having a lower thermal expansion coefficient such as invar and Kovar™ is used, the thermal deformation of the support member during a burn-in test can be avoided. Also, as compared to the case where the support member is made of a single material such as low thermal expansion coefficient alloy such as invar, ceramics, glass or silicon, and the holder holes are formed in such material, the manufacturing cost can be significantly reduced.

The reinforcing member preferably divides the support member into a plurality of regions each of which is formed with a plurality of holder holes. Thus, an optimum mode of reinforcement can be achieved for the given layout of the conductive contact members. If the reinforcing member consists of an annular member extending along an outer peripheral part of the support member, a particularly simple and economical reinforcement can be accomplished. If the layout of the conductive contact members permits, the reinforcing member may be arranged for a maximum reinforcement by dividing the support member into a plurality of regions each of which is formed with a single holder hole.

According to a preferred embodiment of the present invention, the reinforcing member consists of a low thermal expansion metallic member such as invar and Kovar™, and the support member is made of plastic material which is suitable for drilling or otherwise forming holder holes. In such a case, the reinforcing member may be insert molded in the support member. Alternatively, the reinforcing member may be externally attached to the support member.

According to another preferred embodiment of the present invention, the reinforcing member consists of a low thermal expansion metallic member such as invar and Kovar™, and the support member is made of machinable ceramic material which is suitable for drilling or other hole forming processes. In such a case, preferably, the support member is fit into an opening formed in the reinforcing member and integrally joined with the reinforcing member by brazing or using a bonding agent.

The object to be tested such as a semiconductor chip is provided with contact pads that need to be accurately contacted by the conductive contact members, but such pads are not designed for simplifying such a process. It is therefore essential to ensure the positional accuracy of the conductive contact members contacting the object to be tested. In the case of a support member assembly having a layered structure, it can be accomplished by using a support member in the form of a reinforced plate member only in the outer layer thereof facing the object to the tested. If the relay board on the side of the test fixture is designed so as to be tolerant on the positional accuracy of the conductive contact members, the outer layer facing the relay board may not be required to be reinforced. However, if necessary, it is possible to reinforce both the outer layers, and even the intermediate layers may be reinforced.

According to yet another embodiment of the present invention, a particularly economical and simple arrangement is provided by using a pair of annular members which clamp the plate members of the assembly together along an outer periphery thereof for reinforcement.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
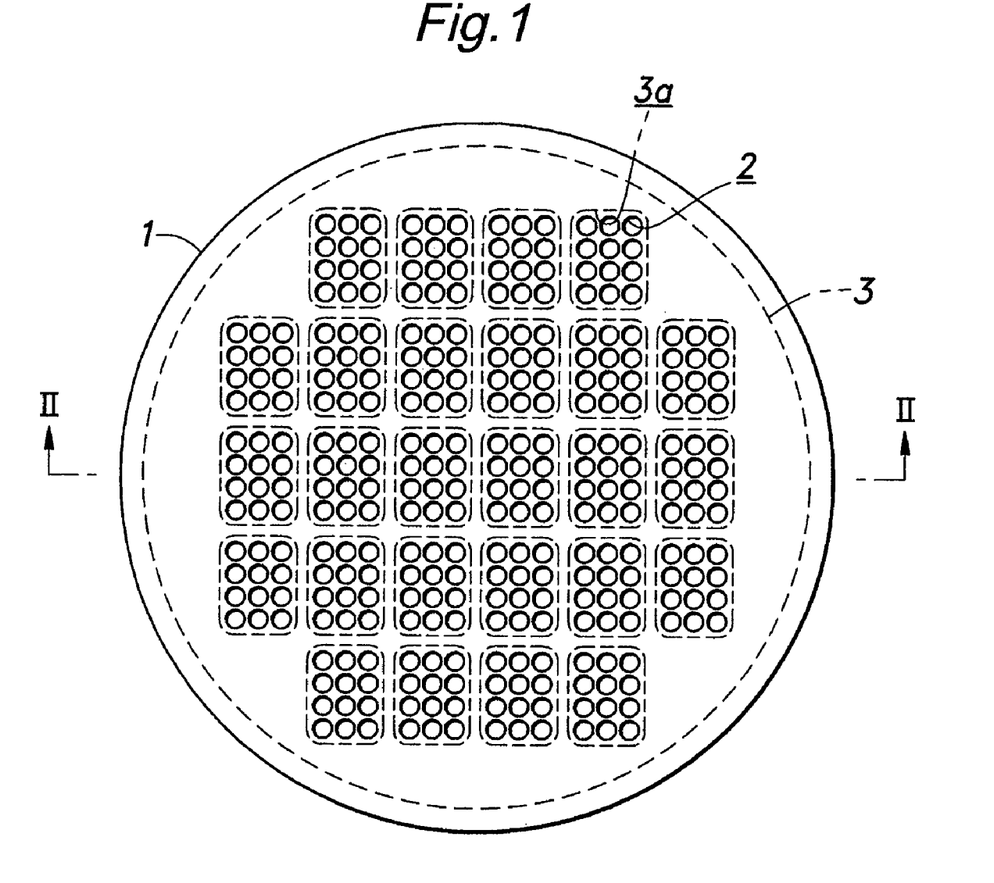
FIG. 1 is a plan view of a support member assembly for use in a contact probe head according to the present invention.
Figure 2:
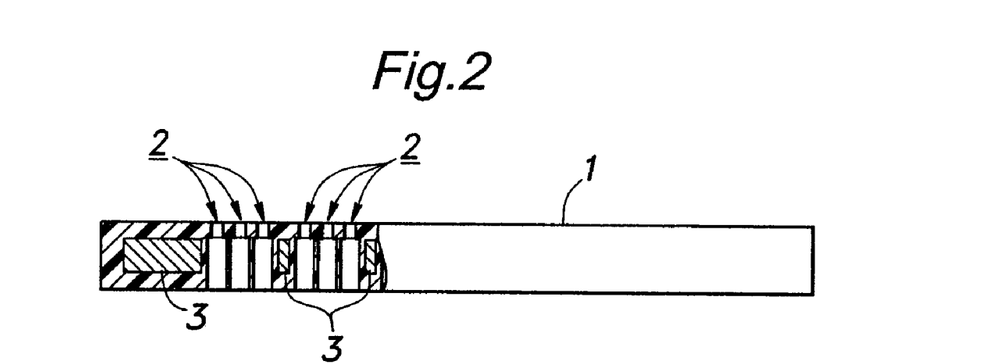
FIG. 2 is a fragmentary sectional view taken along line II-II of FIG. 1.

FIG. 1 is a plan view of a support member assembly 1 for supporting conductive contact members in a contact probe head embodying the present invention, and FIG. 2 is a sectional view taken along line II-II of FIG. 1. The conductive contact members in the form of needle members and coil springs which are to be combined with the support member assembly 1 are omitted in these drawings as they are conventional by themselves. The present invention is applicable also to cases where the coil springs additionally serve as conductive contact members.

When the object to be tested consists of an 8-inch wafer, the support member assembly 1 may consist of a disk having a diameter of approximately 8 inches (approximately 200 mm) as shown in the drawings. The thickness of the support member assembly 1 is typically in the order of 0.5 to 1.5 mm, but may also be in the order of 0.1 to 0.2 mm when a laminated structure is employed. An 8-inch wafer typically contains from tens to hundreds of semiconductor chips formed therein. This support member assembly 1 is also applicable to contact probe heads intended for larger objects such as 12-inch wafers. A 12-inch wafer typically contains thousands of semiconductor chips formed therein.

Referring to FIGS. 1 and 2, the support member assembly 1 is formed with a plurality of groups of holder holes 2 for supporting conductive contact members so as to correspond to the electrodes of a plurality of chips formed on a wafer not shown in the drawings. The shape of each holder hole 2 may be any one of per se known shapes for holder holes. As best shown in FIG. 1, the holder holes 2 are arranged into a number of groups each corresponding to a single chip, and a reinforcing member 3 is buried within the support member assembly 1 in an integral manner.

The reinforcing member 3 extends to a vicinity of the outer periphery of the support member assembly 1 generally in the shape of a disk, and is provided with a plurality of rectangular openings 3a each for accommodating a corresponding group of the holder holes 2. Thus, the reinforcing member 3 occupies a part of the support member assembly 1 where the holder holes 2 are absent or sparsely distributed.

In this support member assembly for a contact probe head, the reinforcing member 3 is formed as a plate member made of heat resistant and low thermal expansion alloy, such as invar and Kovar™, which is formed with the openings 3a corresponding to individual chips by etching, laser machining, stamp forming or other mechanical metal working process, and is integrally buried in the support member made of plastic material by insert molding in the illustrated embodiment. Thus, the support member assembly 1 is integrally incorporated with the reinforcing member 3. Because the area of the support member assembly 1 corresponding to each opening 3a of the reinforcing member 3 is filled with the plastic material, the holder holes 2 can be formed both easily and accurately, and the reinforcing member 3 prevents the thermal deformation of the support member assembly 1.

A second embodiment of the present invention is now described in the following with reference to FIGS. 3 and 4. In these drawings, the parts corresponding to those of the previous embodiment are denoted with like numerals, and description of such parts are omitted. In the second embodiment, the reinforcing member 3 consists of a plate member made of low-thermal coefficient and heat resistant alloy such as invar and Kovar™ and formed with a plurality of rectangular openings 3a each corresponding to an individual semiconductor chip that is to be tested. A holder hole forming member 15 is fit into each of the openings 3a. The holder hole forming member 15 is made of machinable ceramic which is suited to be drilled or otherwise machined, and is formed with a plurality of holder holes 2. The machinable ceramic material may consist of the material marketed under the trade name of "Macerite HSP" by Mitsui Mining Materials. Co., Ltd. of Tokyo, Japan.

Between the holder hole forming member 15 and reinforcing member 3 are interposed a metal plating layer 16 and a brazing layer 17 in that order from the holder hole forming member 15. Each side of the reinforcing member is provided with a plastic layer 18 for electric insulation so that each surface of the holder hole forming member 15 is substantially flush with the outer surface of the corresponding plastic layer 18. A protective layer 19 is formed over the entire surface of the support member assembly 1 primarily to protect the holder hole forming member 15 from mechanical damages. Therefore, the protective layer 19 may be formed only on the side of the holder hole forming member 15 facing the object to be contacted.

Figure 3:
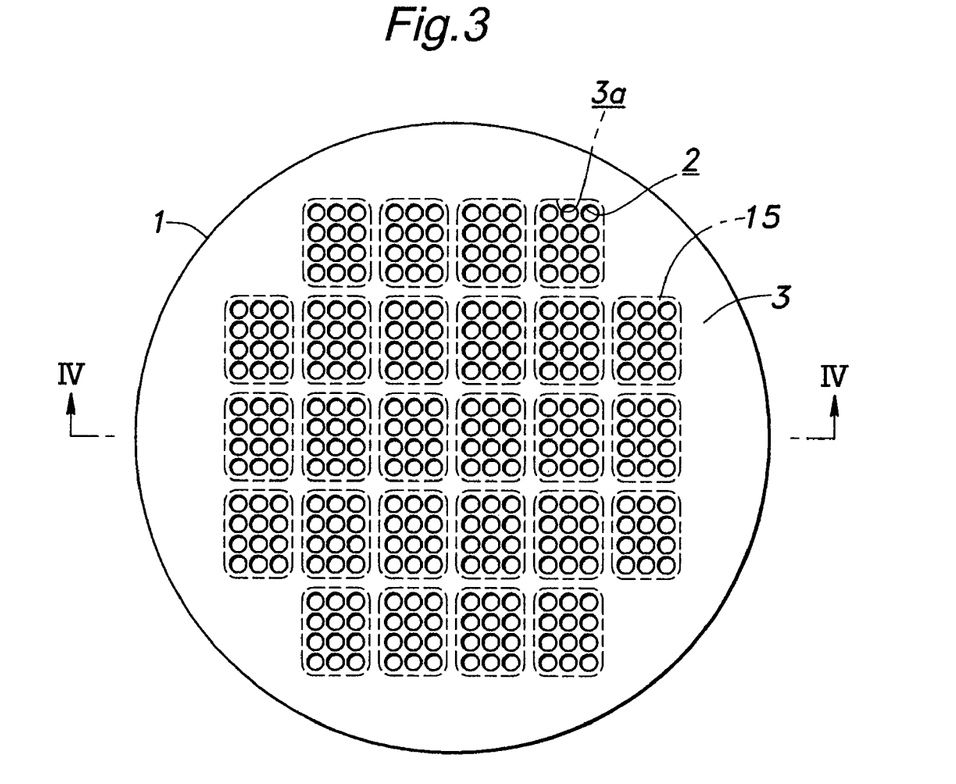
FIG. 3 is a view similar to FIG. 1 showing a second embodiment of the present invention.
Figure 4:
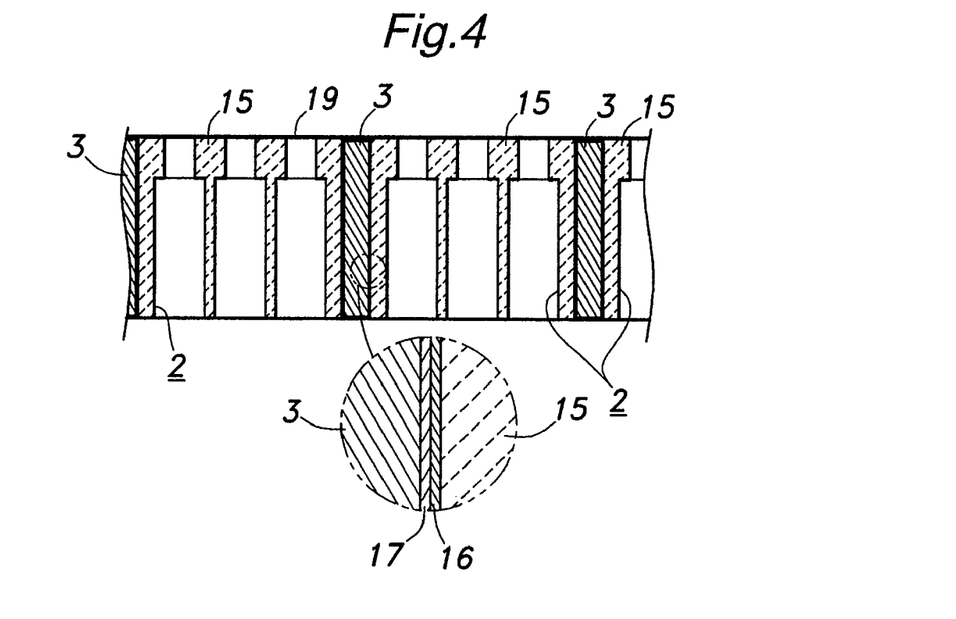
FIG. 4 is a fragmentary sectional view taken along line IV-IV of FIG. 3.
Figure 5:
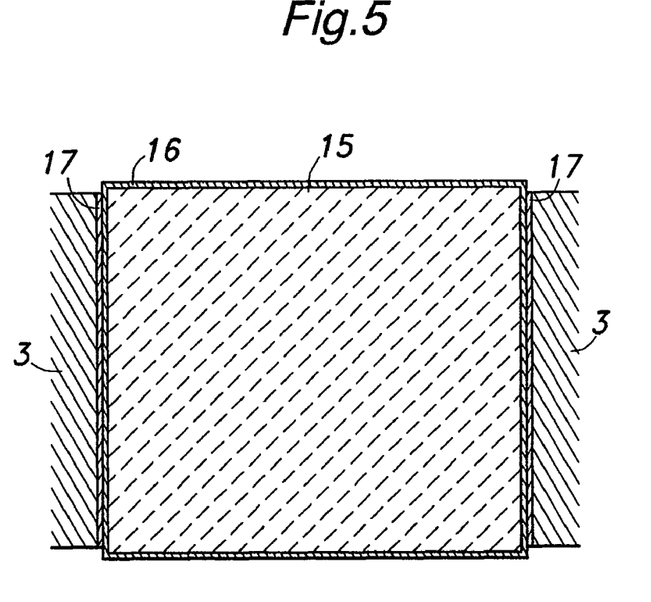
FIG. 5 is a fragmentary sectional view showing a step in the process of fabricating the second embodiment.
Figure 6:
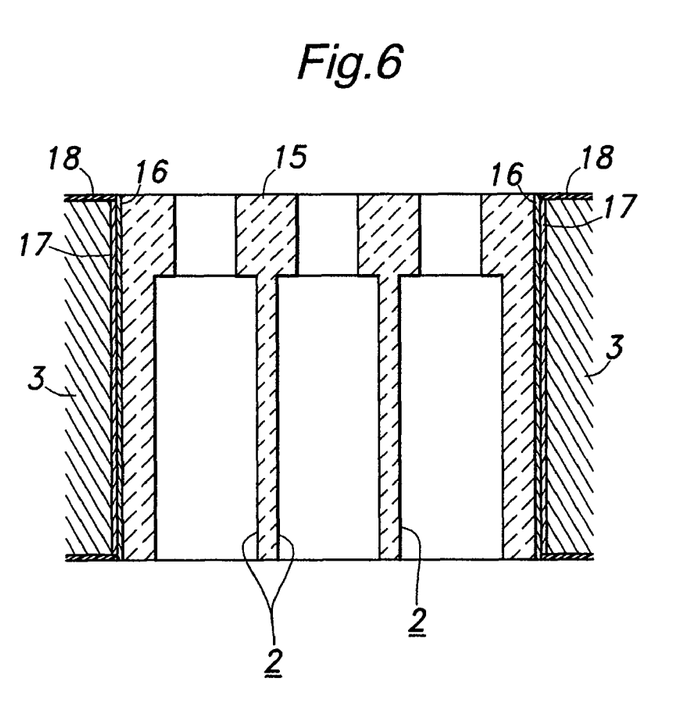
FIG. 6 is a view similar to FIG. 5 showing another step in the process of fabricating the second embodiment.

FIGS. 5 and 6 show the process of fabricating the support member assembly 1 for electroconductive contact units illustrated in FIGS. 3 and 4. First of all, as shown in FIG. 5, the reinforcing member 3 is prepared by forming the openings 3a corresponding to the individual semiconductor chips in a plate member made of such materials as invar and Kovar that have a low thermal expansion coefficient and resistant to heat. The openings 3a may be formed by any known hole forming process such as etching, laser machining, punching, stamping, etc. Thereafter, a plurality of holder hole forming members 15 made of machinable ceramic and dimensioned so as to be slightly thinner than the reinforcing member and snugly fit into the openings 3a are prepared. The entire surface of each holder hole forming member 15 is plated with metal such as nickel by using an electrolytic or non-electrolytic process, and brazing material in the form of foil is wrapped around the entire periphery of the holder hole forming member 15 before it is finally fit into the corresponding opening 3a of the reinforcing member 3. The brazing material may be selected from common solder, high melting point solder, silver or other bracing material. The prepared assembly is placed in an oven providing a temperature suitable for the particular material selected for the brazing, and removed from the oven after the foil of the brazing material has established a firm bonding between the holder hole forming member 15 and reinforcing member 3 is established.

As a result, a metal plating layer 16 and a brazing layer 17 are interposed between the holder hole forming member 15 and reinforcing member 3 in that order from the holder hole forming member 15 to thereby firmly join the two members to each other. The metal plating layer 16 enhances the brazing bonding strength between the two members.

A plurality of holder holes 2 are drilled in each holder hole forming member 15, and a plastic layer 18 for electric insulation is formed on each surface of the reinforcing member 3 in such a manner the surface of the plastic layer 18 is substantially flush with the surface of the holder hole forming member 15. The material for the plastic layer 18 may be selected from acrylic plastic, epoxy plastic or a mixture of plastic material and ceramic material (such as the bonding agent marketed under the trade name of "Aronceramic" by Toagose, Co., Ltd. of Tokyo, Japan). The plastic layer 18 may at least partly extend over the surface of the holder hole forming member 15. Each surface of the assembly is then ground and/or polished until a desired surface finish is achieved (See FIG. 6). As a result, the surface of the holder hole forming member 15 becomes fully exposed.

Because the holder hole forming member 15 is made of machinable ceramic material, it is desirable to take a precautionary measure against mechanical damages. In the illustrated embodiment, the entire surface of the holder member 1 is covered by a protective layer 19 which may be made of fluoride plastic material. If desired, only one side of the support member assembly 1 may be provided with the protective layer 19, or only the holder hole forming member 15 may be coated with the protective layer 19 by using a mask or silk screen process. The brazing layer 17 also serves the function of accommodating the differences in the thermal strains between the holder hole forming member 15 and reinforcing member 3.

If desired, a bonding agent which may consist of plastic material or mixture of plastic and mineral materials such as ceramic material may also be sued instead of the brazing layer 17. In such a case, not only the brazing layer 17 but also the metal plating layer 16 may be omitted. The bonding agent can also serve the function of accommodating the differences in the thermal strains between the holder hole forming member 15 and reinforcing member 3.

Figure 7:
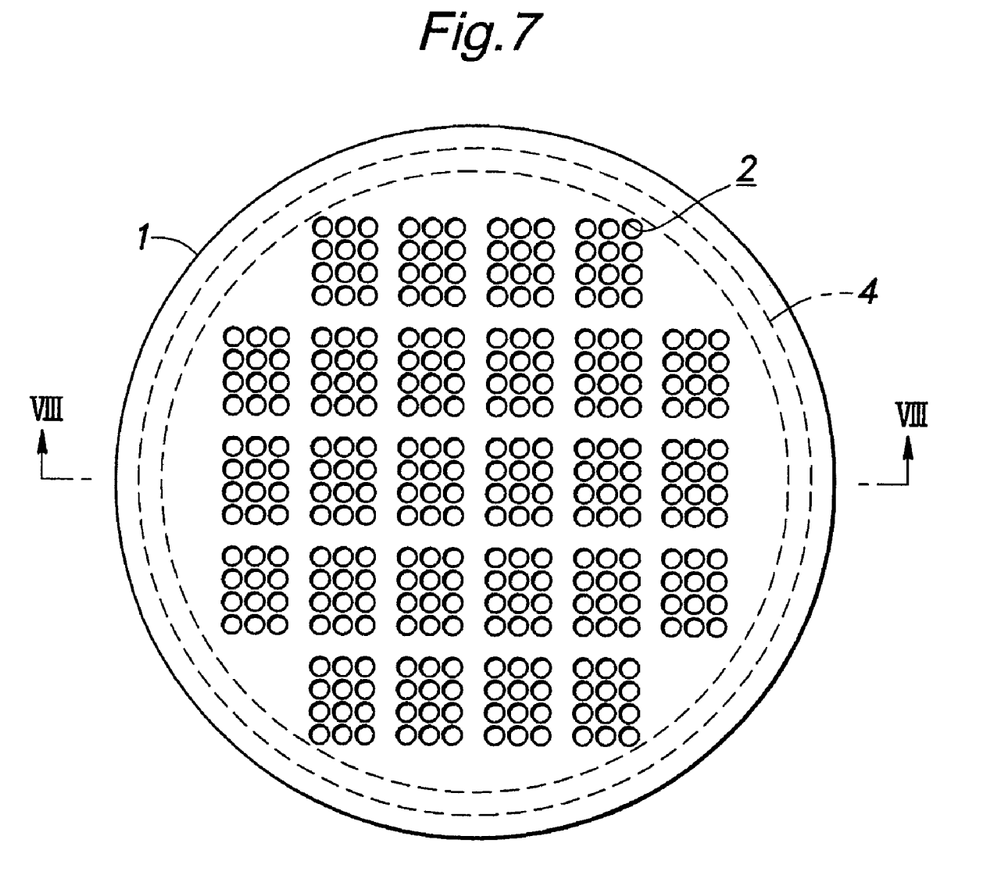
FIG. 7 is a view similar to FIG. 1 showing a third embodiment of the present invention.
Figure 8:
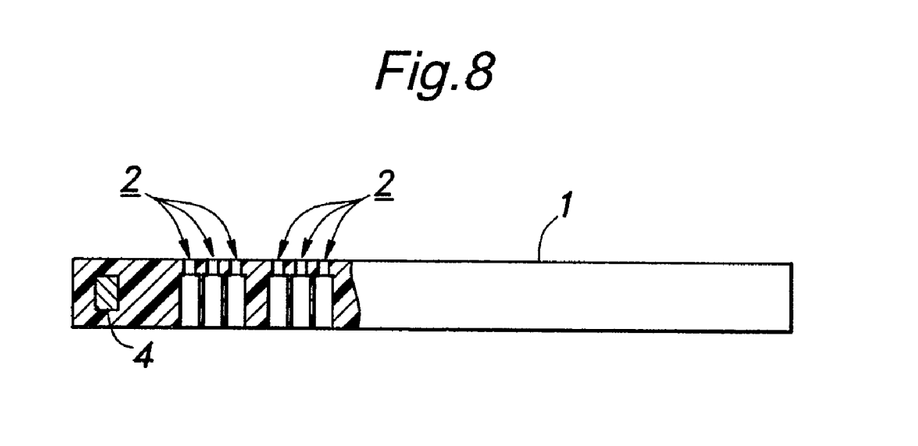
FIG. 8 is a partly broken away sectional view taken along line VIII-VIII of FIG. 7.

A third embodiment of the present invention is now described in the following with reference to FIGS. 7 and 8. In these drawings, the parts corresponding to those of the previous embodiment are denoted with like numerals, and description of such parts are omitted. In the third embodiment, an annular reinforcing member 4 made of invar extends circumferentially in a continuous manner, and is concentrically buried in the support member assembly 1 along an outer peripheral part thereof. The annular member 4, although it consists of a simple ring, can adequately increase the overall mechanical strength of the support member assembly 1 to the extent necessary to prevent an excessive thermal deformation of the support member assembly 1 during a burn-in test. The simplification of the shape of the reinforcing member 4 contributes to the reduction in the manufacturing cost.

Figure 9:
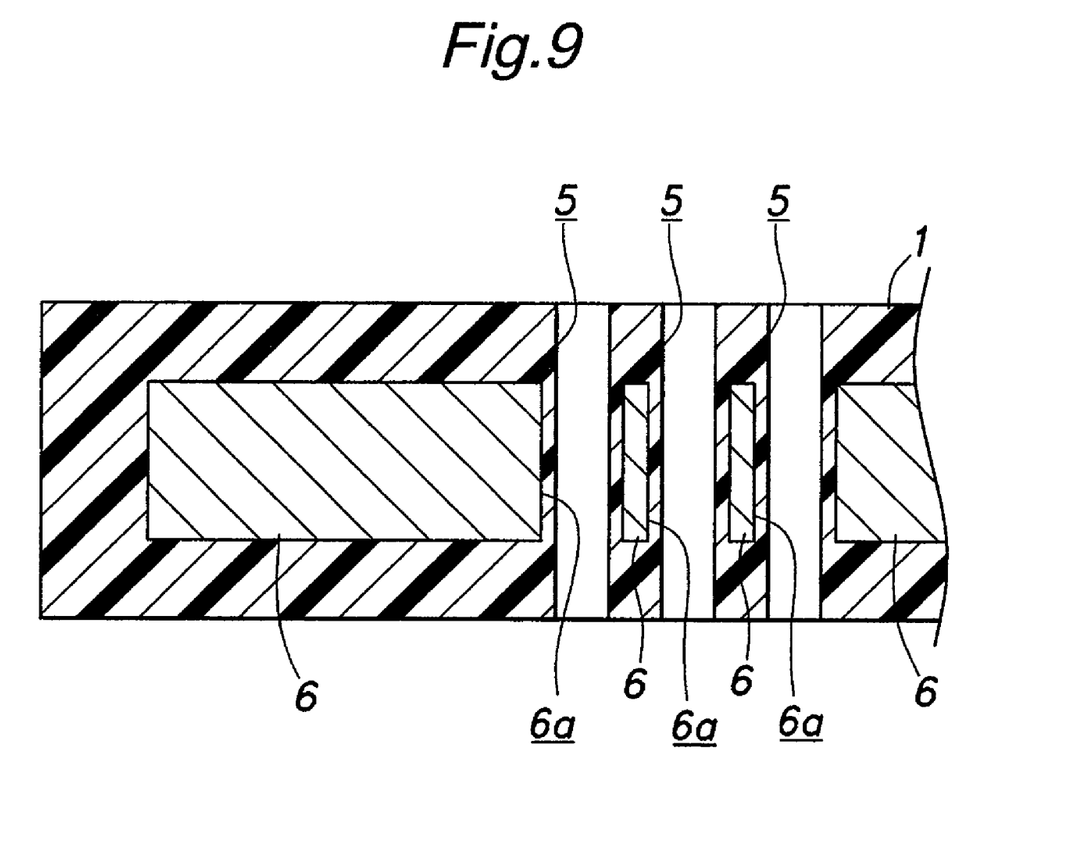
FIG. 9 is an enlarged fragmentary sectional view showing a fourth embodiment of the present invention.

According to the present invention, the shape of the reinforcing member is not limited to those illustrated above. If there is no spatial limitation, the reinforcing member 6 may be provided with a plurality of openings 6a each corresponding to a single holder hole 5 as shown in FIG. 9. According to a support member assembly 1 having such a reinforcing member 6 buried therein, because the part surrounding each holder hole 5 is individually reinforced, the mechanical strength can be improved even further, and this in turn leads to an improved heat resistance and lower thermal expansion coefficient.

Also, the holder holes 5 formed in the support member assembly 1 are not limited to the stepped holes illustrated above, but may also consist of straight holes as shown in FIG. 9 depending on the structure of the conductive contact members. Such an example is described in the following with reference to FIG. 10. The contact probe head 7 illustrated in FIG. 10 has a laminated structure including a reinforced outer layer according to the present invention. A support member assembly 1 incorporated with a reinforcing member 3 similar to that of the embodiment illustrated in FIGS. 1 and 2 is formed with holder holes 5 consisting of straight holes such as those illustrated in FIG. 9, and is used as an outer layer opposing the object to be accessed in a support member assembly 7a of the contact probe head 7 by combining it with plastic plate members 8 and 9 which may not be provided with any reinforcing member, for instance. In the illustrated embodiment, a pair of plate members 8 and 9 are used in combination with the support member assembly 1, but the support member assembly 1 may be combined with any number of plate members in the laminated structure.

Figure 10:
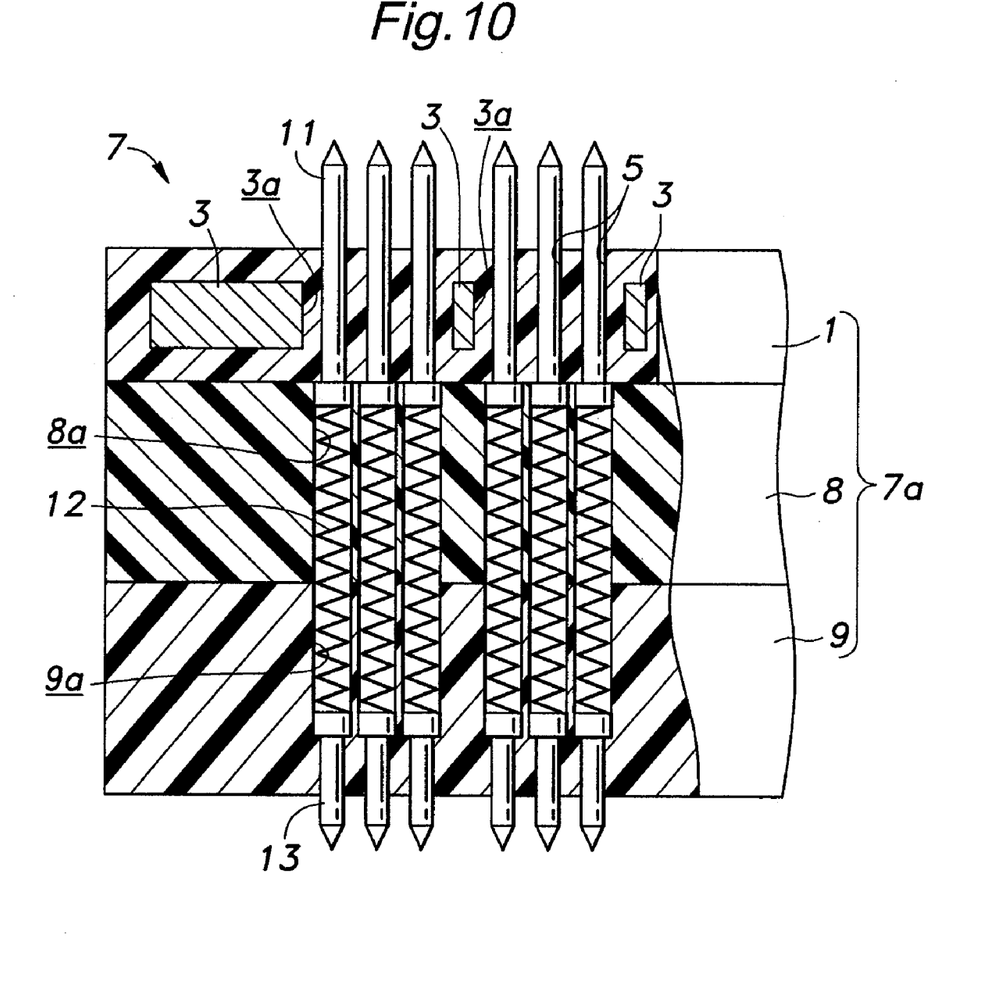
FIG. 10 is an enlarged sectional side view of a contact probe head including a support member assembly given as a fifth embodiment of the present invention.

In this contact probe head 7, the stem portion of each of a plurality of per se known conductive needle members 11 is slidably received in a corresponding one of the holder holes 5. The plate member 8 serving as an intermediate layer of the support member assembly 7a is formed with enlarged through holes 8a which align with the corresponding holder holes 5. The plate member 9 serving as the outer layer facing away from the object to be accessed is formed with stepped holes 9a which align with the corresponding holder holes 5. Each straight through hole 8a receives an enlarged part of the corresponding conductive needle member 11 and a coil spring 12, and each stepped hole 9a receives a part of the corresponding coil spring 12 and a conductive needle member 13 for engaging a pad on a relay board not shown in the drawings. The opposing conductive needle members 11 and 13 are resiliently urged away from each other by the coil spring 12, and are prevented from being dislodged from the holder hole 5 by their enlarged portions engaged by annular shoulders defined in the support member assembly 7a.

The support member assembly 1 is arranged as the outer layer opposing the object to be contacted (such as the electrodes 26a in the prior art of FIG. 14) in the foregoing embodiment, and this ensures the positional accuracy of each conductive contact member with respect to the object to be accessed owing to the presence of the reinforcing member 3. The other outer layer or the lower layer is not incorporated with a reinforcing member. However, because the lower layer opposes a relay board or the like which is provided with contact pads for the convenience of contact as opposed to such objects to be contacted as semiconductor devices which are designed without such considerations, the lower layer 9a may not be required to be reinforced. As can be readily appreciated, if desired, the lower layer and/or intermediate layer may be reinforced. At any even, such a reinforcing member may consist of a member having a small thickness which can be worked into fine shapes at low cost by etching or the like.

Figure 11:
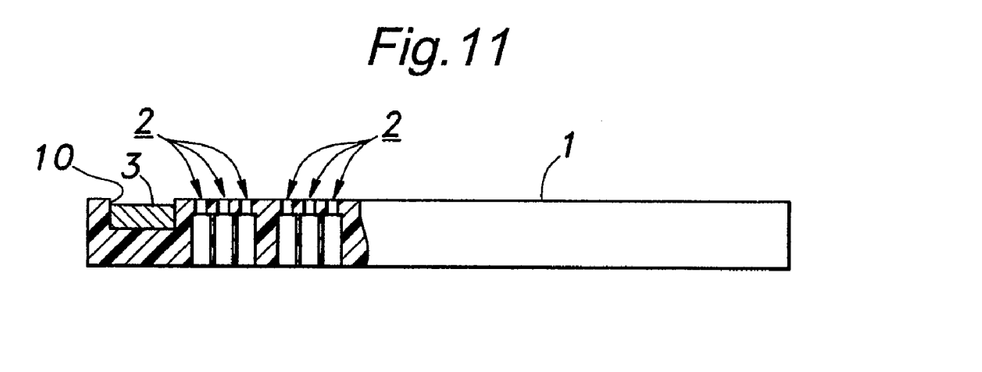
FIG. 11 is a view similar to FIG. 2 showing a sixth embodiment of the present invention.

Although the reinforcing member was buried in the support member in each of the foregoing embodiments, the reinforcing member is only required to be integrally attached to the support member, and is not necessarily required to be buried in the support member. An alternate embodiment of the mounting structure for the reinforcing member is shown in FIG. 11. Referring to FIG. 11, an annular reinforcing member 3 such as the one illustrated in FIGS. 7 and 8 is used. After holder holes 2 and an annular groove 10 for mounting the reinforcing member 3 are formed in the support member assembly 1, the reinforcing member 3 is fitted into the annular groove 10, and the reinforcing member 3 is integrally attached to the support member assembly 1 by using a bonding agent, threaded bolts or other securing means. If desired, to achieve an even higher level of precision, the holder holes 2 may be formed after the reinforcing member 3 is incorporated in the support member assembly 1. If necessary, the annular groove 10 may be filled with resin material or the like. This embodiment provides similar advantages as those of the previous embodiments.

Figure 12:
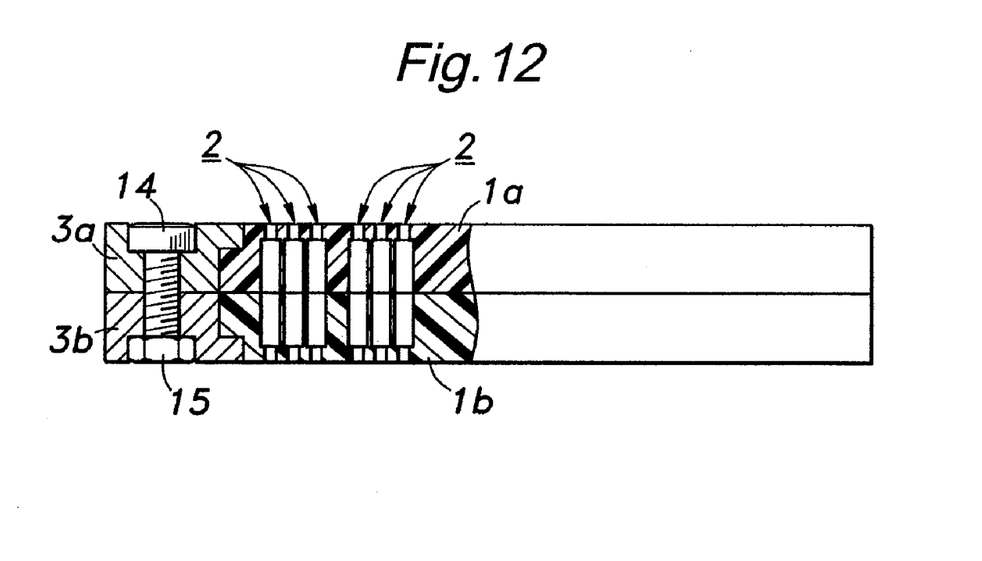
FIG. 12 is a view similar to FIG. 2 showing a seventh embodiment of the present invention.

FIG. 12 shows yet another embodiment of the present invention. First of all, a pair of support members 1a and 1b made of plastic material for forming holder holes are prepared. The outer peripheral par of each support member assembly 1a and 1b is formed with an annular shoulder which may be formed at the time of molding the support member or may be machined after it has been molded. Holder holes 2 are formed in each of the support members 1a and 1b, and with the two support members 1a and 1b placed one over the other, a pair of annular reinforcing members 3a and 3b adapted to engage the annular shoulders and made of such material as invar are fitted on the outer peripheral part of the support members 1a and 1b. Then, the support members are firmly joined to each other by using a suitable number of threaded bolts 14 passed through the reinforcing members 3a and 3b and nuts 15 threaded with the threaded bolts 14. The annular reinforcing members 3a and 3b not only thus join the two support members to each other but also increases the mechanical rigidity of the support members 1a and 1b, and controls the deformation thereof due to thermal expansion.

Figure 13:
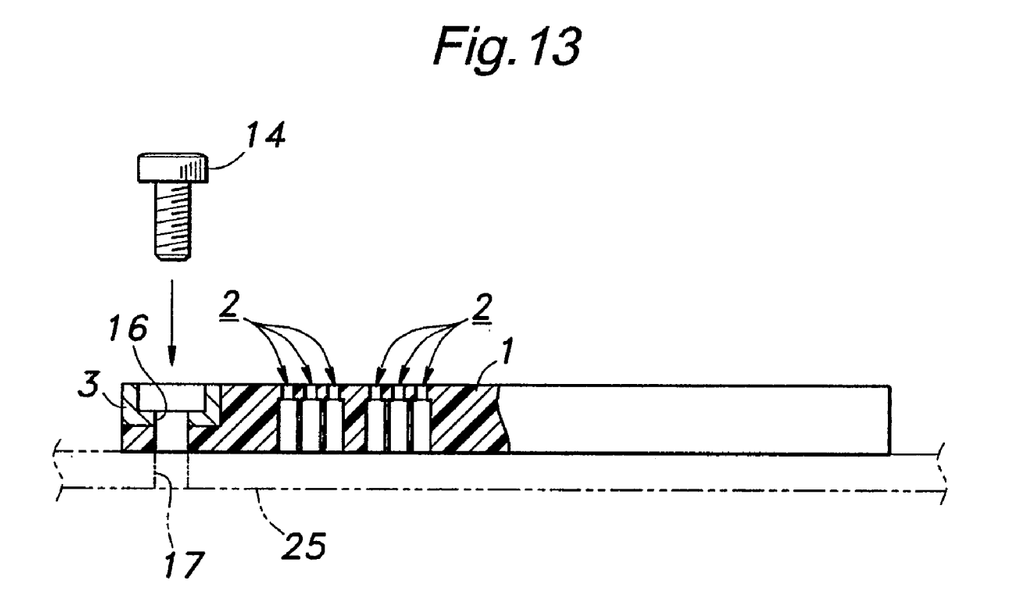
FIG. 13 is a view similar to FIG. 2 showing a eighth embodiment of the present invention.

FIG. 13 shows yet another embodiment of the present invention. In this embodiment, the support member assembly 1 consists of a single plate member made of plastic material suitable for forming holes, and the holder holed 2 consist of stepped holed. The outer peripheral part of the support member assembly 1 is formed with an annular shoulder, and an annular reinforcing member 3 made of material such as invar having a complementary shape to the annular shoulder is fitted on the outer peripheral part of the support member assembly 1. Thus, the support member assembly 1 when combined with the annular reinforcing member 3 defines a substantially perfect disk as a whole. The annular reinforcing member 3 is formed with a plurality of mounting holes 16 and corresponding holes aligning there to are formed in the corresponding parts of the outer periphery of the support member assembly 1. The relay board 25 which is to be laid over the surface of the support member assembly 1 corresponding to the large diameter ends of the holder holes 2 is provided with threaded holes 17 corresponding to the mounting holes 16. Therefore, when the threaded bolts 14 are passed through the annular reinforcing member 3 which is fitted on the support member assembly 1, and threaded into the corresponding threaded holes 17, the reinforcing member 3 can be attached to the relay board 25 jointly with the support member assembly 1. Each mounting hole 16 of the annular reinforcing member 3 is provided with a large diameter end adapted to receive the head of the threaded bolt 14 so that the head of the threaded bolt 14 would not project from the profile of the assembly.

In any of the foregoing embodiments, the plastic material forming the part in which the holder holes are formed may consist of any plastic material as long as it is resistant to heat of temperature in the order of 150° C. in the case of a burn-in test, and has a relative low thermal expansion coefficient. It should be also suitable for precise hole drilling so as to provide a maximum freedom of design. For instance, the holder holes are not limited to the stepped holes and straight holes, but may also consist of tapered holes or holes of any other shape so as to permit the use of various forms of conductive contact members in addition to the combination of needle members and coil springs shown in the illustrated embodiments. The plastic material may also be additionally reinforced by glass fibers, graphite fibers or other material.

The contact probe head using the support member assembly of the present invention is suitable not only for burn-in tests but also for other applications where heat resistance is required. Particularly suitable applications include the use as burn-in sockets, contact probe heads for MPU devices which involve electrode pads arranged at a high density, and contact probe heads for MCM (multi chip module) devices having a plurality of groups of electrode pads arranged at a high density where a high mechanical strength is required.

Although the present invention has been described in terms of preferred embodiments thereof, it is obvious to a person skilled in the art that various alterations and modifications are possible without departing from the scope of the present invention which is set forth in the appended claims.

INDUSTRIAL APPLICABILITY

Thus, according to the present invention, the reinforcing member increases the overall mechanical strength of the support member assembly, and when it is made of a heat resistant and low thermal coefficient material, prevents the thermal deformation of the support member. Because the holder holes are formed in the support member made of material suitable for forming holes, such as plastic material, the holder holes can be formed at high precision and at low cost. The support member assembly according to the present invention is thus particularly suitable for use in contact probe heads for burn-in tests, and contributes to the reduction in the cost of the contact probe head.

By providing the reinforcing member in parts of the support member where conductive contact members are relatively sparsely distributed or so as to surround each group of conductive contact members, it is possible to achieve a reinforcement which suits the particular layout of the conductive contact members. In particular, when a simple annular reinforcement member is used, the manufacturing cost can be particularly reduced owing to the simplicity of the reinforcement member.

When the support member assembly is formed by laminating a plurality of plate members, by reinforcing only the outer layer facing the object to be contacted, the positional accuracy of the conductive contact members of the contact probe head with respect to the objected to be contacted can be increased without requiring any significant change in the design of the remaining part of the contact probe head. In this case, because the reinforcing member is needed only in the outer layer of the laminated structure, the cost of the contact probe head suitable for a wafer level burn-in test can be provided at low cost.

The invention claimed is:

1. A support member assembly suitable for use in a contact probe head or the like for contacting an object to be contacted, comprising:
   a reinforcing member extending in a plane and having a certain thickness, the reinforcing member defining at least one opening extending across the thickness thereof; and
   a support member made of plastic material and filling the opening defined in the reinforcing member, the support member being formed with a plurality of holder holes extending across a thickness thereof and substantially perpendicularly to the plane of the reinforcing member for supporting conductive contact members in a mutually parallel relationship.

2. A support member assembly according to claim 1, wherein the reinforcing member divides the support member into a plurality of regions each of which is formed with a plurality of holder holes.

3. A support member assembly according to claim 1, wherein the reinforcing member divides the support member into a plurality of regions each of which is formed with a single holder hole.

4. A support member assembly according to claim 1, wherein the reinforcing member consists of a low thermal expansion metallic member, and the support member is made of plastic material.

5. A support member assembly according to claim 4, wherein the reinforcing member is insert molded in the support member.

6. A support member assembly according to claim 1, wherein the support member is made of ceramic material.

7. A support member assembly according to claim 6, wherein the reinforcing member consists of a low thermal expansion metallic member.

8. A support member assembly according to claim 7, wherein the reinforcing member is attached to the support member in a manner characteristic of brazing.

9. A support member assembly according to claim 8, further comprising a metal plating underlay wherein the support member is brazed to the reinforcing member via a metal plating under layer.

* * * * *